United States Patent
An et al.

(10) Patent No.: US 6,245,618 B1
(45) Date of Patent: Jun. 12, 2001

(54) MOSFET WITH LOCALIZED AMORPHOUS REGION WITH RETROGRADE IMPLANTATION

(75) Inventors: Judy X. An, San Jose; Bin Yu, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/243,487

(22) Filed: Feb. 3, 1999

(51) Int. Cl.[7] .................................................. H01L 21/336
(52) U.S. Cl. .......................... 438/289; 438/290; 438/291; 438/282; 438/526; 257/368
(58) Field of Search .................................. 438/289, 282, 438/290, 291, 526; 257/368

(56) References Cited

U.S. PATENT DOCUMENTS 4,633,289   12/1986   Chen ........................................ 357/42
5,602,045   2/1997   Kimura .................................... 437/24
5,675,176 * 10/1997   Ushiku et al. .......................... 257/617

OTHER PUBLICATIONS

John Yuan–Tai Chen, "Quadruple–Well CMOS for VLSI Technology", IEEE Transactions on Electron Devices, vol. ED–31, No. 7, Jul. 1984.

* cited by examiner

*Primary Examiner*—Long Pham

(57) ABSTRACT

A semiconductor device with improved short channel characteristics is formed with a buried amorphous region comprising a retrograde impurity region having the impurity concentration peak of the semiconductor substrate. The buried amorphous region, formed below the channel region, suppresses diffusion of displaced atoms and holes from the source/drain regions and reduces the resistance against latch-up phenomenon, thereby improving short channel characteristics.

8 Claims, 4 Drawing Sheets

MOSFET WITH LOCALIZED AMORPHOUS REGION WITH RETROGRADE IMPLANTATION

FIELD OF THE INVENTION

The present invention relates generally to a semiconductor device comprising transistors, and to a method of manufacturing the semiconductor device. The present invention has particular applicability in manufacturing a reliable high-density Metal Oxide Semiconductor Field Effect transistor (MOSFET) device with submicron dimensions.

BACKGROUND ART

The escalating requirements for high performance and density associated with ultra large scale integration semiconductor devices require high speed and reliability and increased manufacturing throughput for competitiveness. As gate lengths are reduced to increase the speed and density, problems such as short channel effects are encountered. For example. "punch through" arises when the drain voltage reaches a sufficient large value, and the depletion layer associated with the drain spreads across the substrate and reaches the source, thereby enabling the charge carriers in the drain region to punch through to the source. In addition, "hot carrier injection" arises when device dimensions are reduced but the supply voltage is maintained, thereby increasing the electric field generated in the silicon substrate. Such an increased electric field enables electrons in the channel region to gain sufficient energy to be injected onto the gate oxide, resulting in device degradation.

Various methods have been proposed to solve the short channel effects. According to the method disclosed in U.S. Pat. No. 5,602,045 by Kimura, shallow source/drain regions are formed within amorphous regions to suppress an increase of dislocated charge carriers at the interface between the amorphous region and substrate. As shown in FIG. 1, pocket regions 18 are formed in the surface portions of a p-well region 12 formed in the surface portion of a semiconductor substrate 10, by ion implanting a p type impurity, as shown by arrows A, employing gate oxide 16, gate electrode 17 and field oxide regions 14 as a mask. Then, lightly doped impurity layers 20 are formed within the confines of the pocket regions 18 by ion implanting an n type impurity, as shown by arrows B in FIG. 2.

After forming $SiO_2$ sidewall spacers 30 on the side surfaces of the gate electrode 17 and gate oxide 16, as shown in FIG. 3, amorphous layers 32 are formed within the confines of the lightly doped impurity layers 20, by implanting ions with large mass numbers, e.g., Si, Ge, As, as shown by arrows C, employing the gate oxide 16, gate electrode 17, sidewall spacers 30 and field oxide 14 as a mask. The depth of amorphous layers 32 is determined to be greater than the depth of subsequently formed impurity layers 40. The amorphous layers 32 are formed while cooling the substrate 10 and well region 12 to reduce junction leak current from the impurity layers 40 to the well region 12.

As shown in FIG. 4, the impurity layers 40 are then formed by ion implanting an n type impurity, as shown by arrows D, to a depth smaller than that of the amorphous layer 32 even after a subsequent annealing step, thereby suppressing dislocated carrier charges at the interface between the amorphous layers 32 and the well region 12. As shown in FIG. 4, the resulting device comprises the shallow impurity layers 40 formed within the confines of the amorphous regions 32 which, in turn, are within the confines of the light doped impurity layers 20. Accordingly, the method disclosed in U.S. Pat. No. 5,602,045 forms the shallow impurity regions 40, obtaining reduced junction leakage. However, the amorphous layers 32. formed between the impurity regions 40 and lightly doped impurity layers 20, reduce the mobility of the carriers moving between the impurity regions 40 and lightly doped impurity layers 20, thereby reducing the device speed.

There is a need for efficient methodology for manufacturing a semiconductor device exhibiting improved short channel characteristics.

DISCLOSURE OF THE INVENTION

An advantage of the present invention is a simplified, efficient and production worthy methodology for manufacturing a MOSFET exhibiting improved short channel characteristics.

Another advantage of the present invention is a semiconductor device exhibiting improved short channel characteristics.

Additional advantages and other features of the present invention will be set forth in part in the description which follows and in part will become apparent to those having ordinary skill in the art upon examination of the following description or may be learned from the practice of the present invention. The objectives and advantages of the present invention maybe realized and obtained as particularly pointed out in the appended claims.

According to the present invention, the foregoing and other advantages are achieved in part by a method of manufacturing semiconductor device, the method comprising: forming a first conductivity type impurity source/drain regions with a channel region therebetween in a portion of a main surface of a substrate containing a second conductivity type; ion implanting atoms into the substrate to form a buried amorphous region below the channel region; and ion implanting a second conductivity type impurity into the substrate to form a retrograde impurity region having an impurity concentration peak within the confines of the buried amorphous region.

Another aspect of the present invention is a semiconductor comprising: a substrate containing a first conductivity type impurity; source/drain regions formed in the substrate with a channel region therebetween; a gate dielectric layer overlying the channel region; a gate electrode on the gate dielectric layer; a buried amorphous region formed below the channel region; and a retrograde impurity region, formed in the substrate, comprising an impurity concentration peak within the confines of the buried amorphous region.

Additional advantages of the present invention will become readily apparent to those skilled in the art from the following detailed description, wherein only the preferred embodiment of the present invention is shown and described, simply by way of illustrating the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature and not restrictive.

DESCRIPTION OF INVENTION

Figure 1:
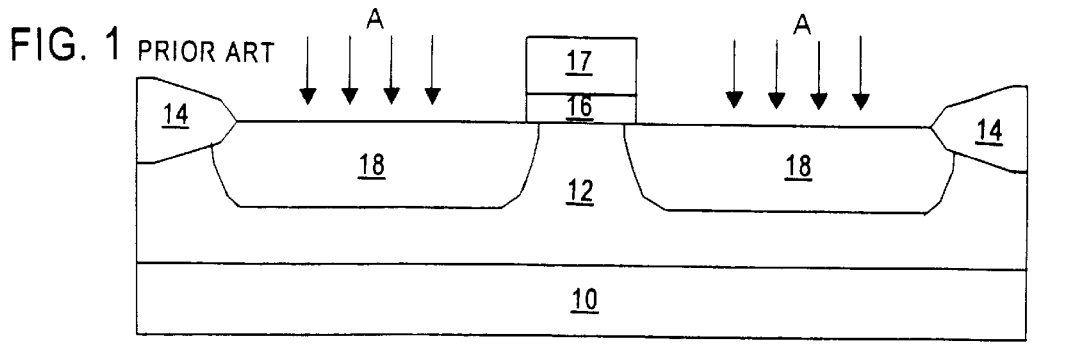
FIG. 1 to FIG. 4 illustrate sequential phases of a prior art method, similar features being denoted by similar reference numerals.
Figure 2:
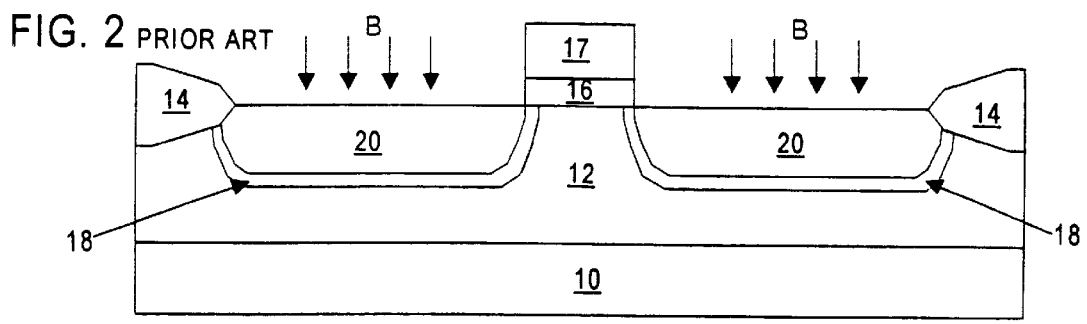
Figure 3:
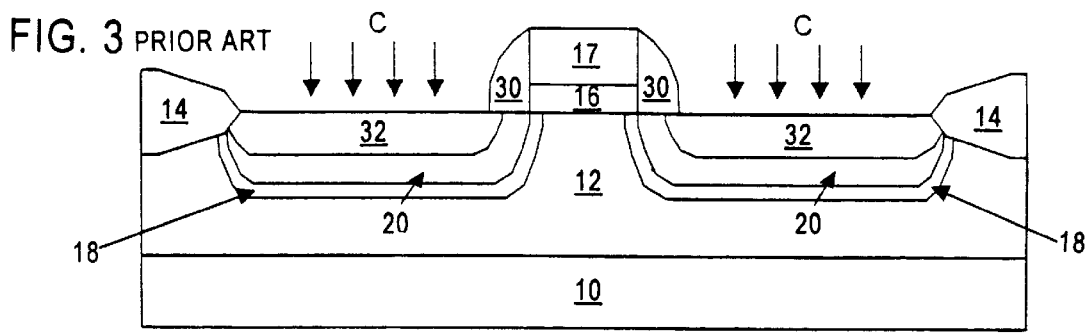
Figure 4:
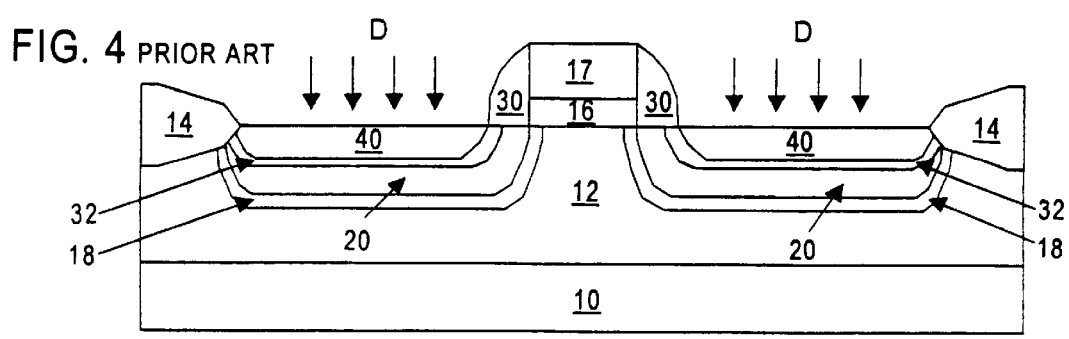
Figure 5:
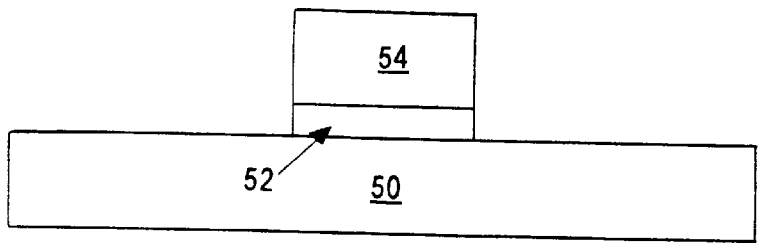
FIG. 5 to FIG. 17 illustrate sequential phases of a method according to an embodiment of the present invention, similar features being denoted by similar reference numerals.
Figure 6:
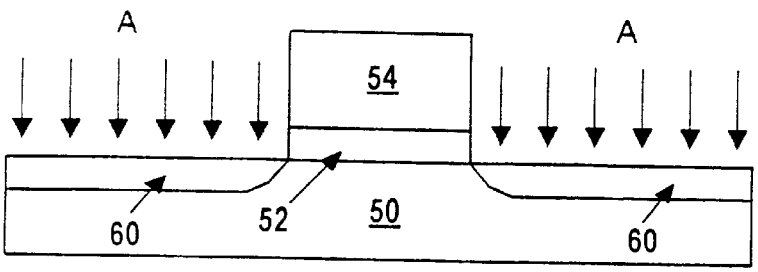
Figure 7:
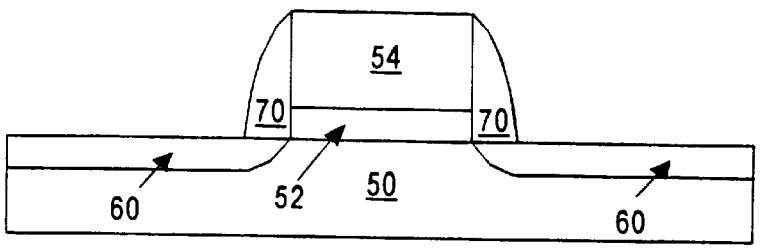
Figure 8:
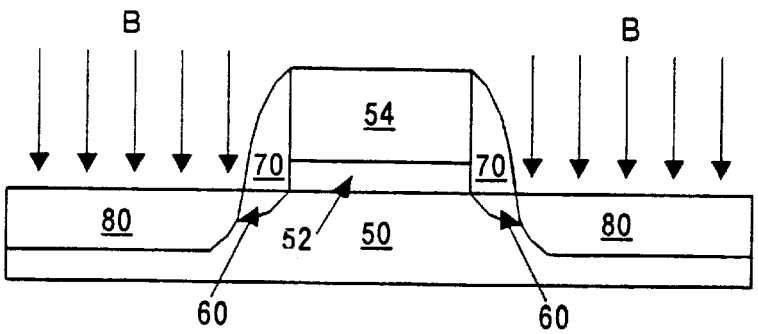
Figure 9:
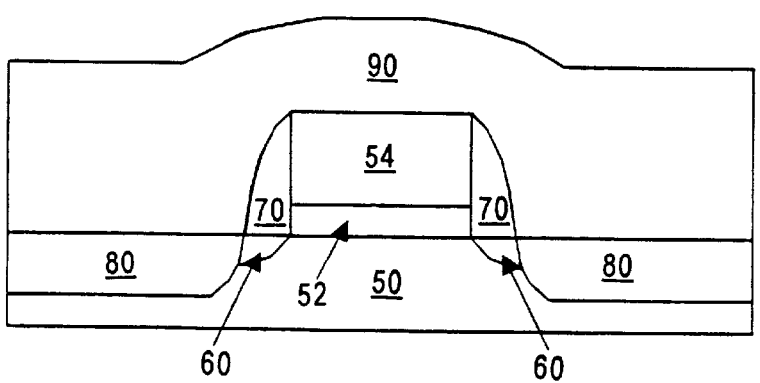
Figure 10:
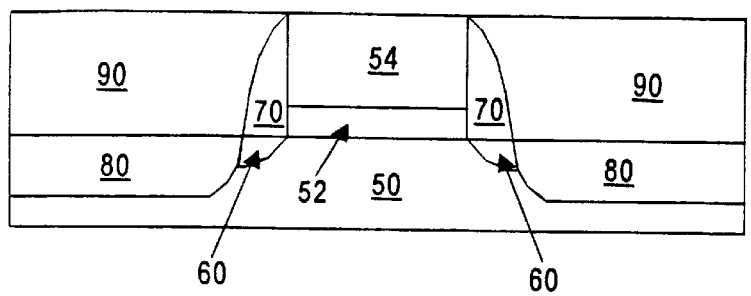
Figure 11:
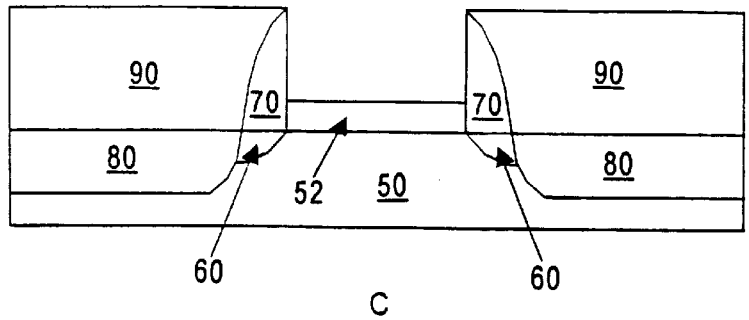

The present invention enables manufacturing semiconductor devices exhibiting high density and reliability by forming an amorphous region under the channel region between source/drain regions and setting the impurity concentration peak of a retrograde well within the confine of the amorphous region such that the amorphous region functions as a channel stop by suppressing diffusion of the displaced atoms and holes from source/drain regions. Accordingly, the present invention provides semiconductor devices with improved short channel characteristics An embodiment of a method in accordance with the present invention is schematically illustrated in FIGS. 5–17. As shown in FIG. 5, temporary gate oxide 52 and gate electrode 54 are formed on the main surface of a semiconductor substrate or a well region 50 lightly doped by a p type impurity. As shown in FIG. 6, shallow source/drain extensions 60 are formed in the surface portions of the substrate 50 by ion implanting an n-type impurity, as shown by arrows A, employing the temporary gate oxide 52 and gate electrode 54 as a mask. After forming sidewall spacers 70 at the side surfaces of the temporary gate oxide 52 and gate electrode 54 as depicted in FIG. 7, source/drain regions 80 are formed by ion implanting n-type impurity, as shown by arrows B in FIG. 8, employing the temporary gate oxide 52 and gate electrode 54 and the sidewall spacers 70. A dielectric layer 90 is formed on the surface of the semiconductor substrate 50, covering the temporary gate oxide 52, gate electrode 54 and sidewall spacers 70, as shown in FIG. 9. Then, the surface of the dielectric layer 90 is planarized, as shown in FIG. 10, exposing the temporary gate electrode 54. The temporary gate electrode 54 is then removed, as shown in FIG. 11, exposing the temporary gate oxide 52.

Figure 12:
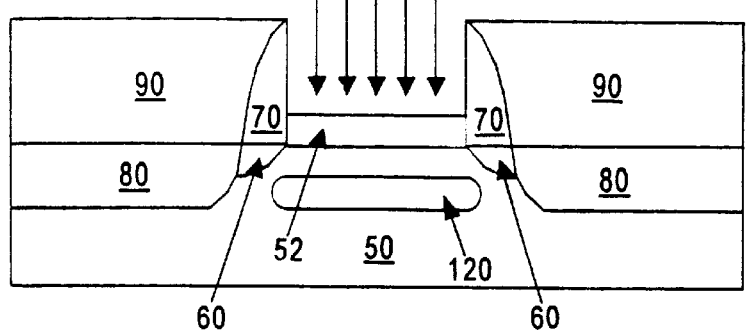

Subsequent to removing the temporary gate electrode 54, buried amorphous region 120 is formed below the channel region between the source/drain regions 80. The buried amorphous region 120 can be formed by ion implanting atoms, as shown in FIG. 12, employing the dielectric layer 90 and sidewall spacers 70 as a mask. The type of atoms to be implanted to form the buried amorphous region 120 is preferably from elements having substantially large mass numbers, e.g., germanium, oxygen, silicon, and antimony. In a preferred embodiment of the present invention, germanium atoms are ion implanted to form the buried amorphous region 120, as at an implantation dosage of about $1 \times 10^{13}$ atoms cm$^{-2}$ to about $8 \times 10^{14}$ atoms cm$^{-2}$ and an implantation energy level of about 15 KeV to about 50 KeV, depending upon the projection depth needed for the technology.

Figure 13:
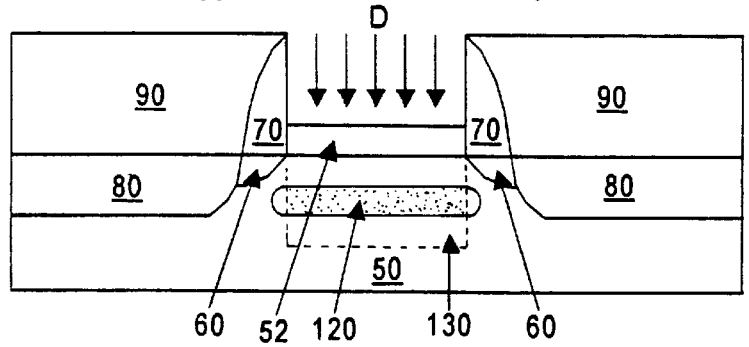

Retrograde impurity region 130 is then formed under the main surface of semiconductor substrate 50 to achieve a gradually increasing impurity concentration under the main surface of the semiconductor substrate 50, as illustrated in FIG. 13. The retrograde impurity region 130 has an impurity concentration peak within the confines of the amorphous region 120. In this embodiment, the retrograde impurity region 130 is formed by ion implanting a p type impurity, as shown by arrows D, employing the dielectric layer 90 and sidewall spacers 70 as a mask, to achieve a gradually increasing impurity concentration in the semiconductor substrate 50 below the temporary gate oxide 52. Such a method of forming a gradually increasing impurity concentration, known as a retrograde well or retrograde implantation, is conventionally achieved by ion implanting impurity ions with a high energy into a semiconductor substrate, for example, as disclosed in John Yuan-Tai Chen, "Quadruple-well CMOS for VLSI technology," IEEE Transactions on Electron Devices, vol. ED-31, No. 7, July 1984 and U.S. Pat. No. 4,633,289. The retrograde impurity region 130 reduces the resistance against the latch-up phenomenon, thereby improving the transistor's reliability. Also, the retrograde impurity region 130 and the amorphous region 120 function as a channel stop by suppressing diffusion of the displaced atoms and holes from source/drain regions, providing semiconductor devices with improved short channel characteristics.

Embodiments of the present invention include subsequent processing, as by annealing to repair lattice damage caused by ion implantation, e.g., rapid thermal annealing at a temperature of about 1020° C. to about 1050° C. for about 2 seconds to about 20 seconds in a nitrogen ($N_2$)containing environment, followed by conventional processing.

Figure 14:
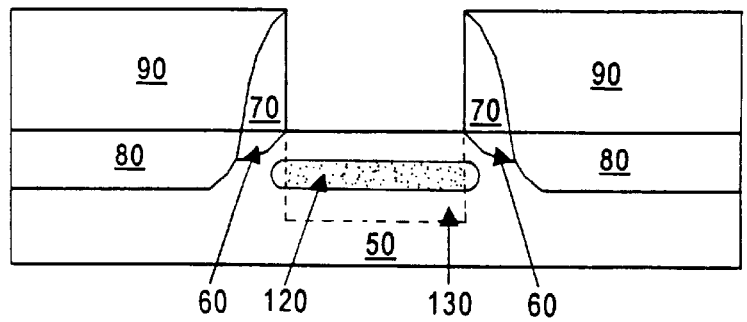
Figure 15:
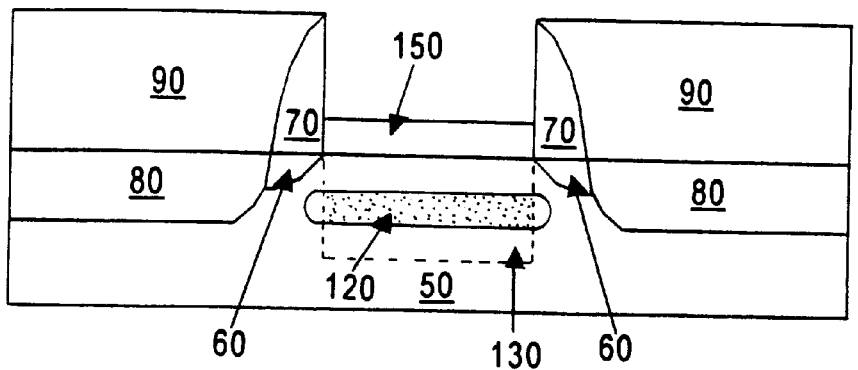
Figure 16:
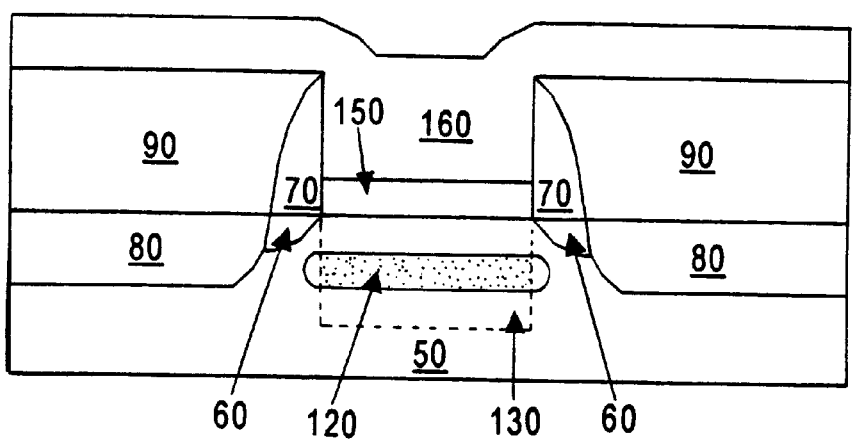
Figure 17:
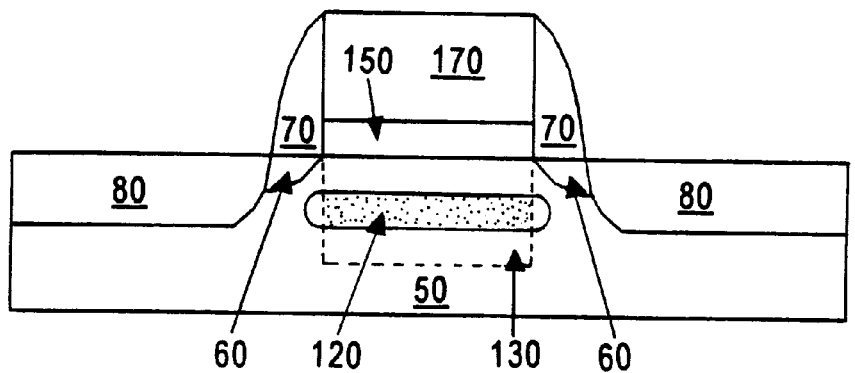

Embodiments of the present invention also comprise: removing the temporary gate 62, as shown in FIG. 14; forming a gate oxide 150 as shown in FIG. 15; depositing a conductive layer 160 as shown in FIG. 16; planarizing, as by chemical mechanical polishing, the surface of the conductive layer 160, thereby forming gate electrode 170; and removing the dielectric layer 90 as shown in FIG. 17.

The material processing techniques, such as deposition, photolithographic and etching techniques, employed in the present invention are those typically employed in manufacturing conventional semiconductor devices and, hence, are not set forth herein in detail.

An embodiment of a structure in accordance with the present invention is schematically illustrated in FIG. 17 and comprises buried amorphous region 120 formed in the portion of semiconductor substrate 50 underlying the channel region between shallow source/drain extensions 60. In this embodiment, the semiconductor substrate 50 is doped with a p type impurity and the shallow source/drain extensions 60 and source/drain region 80 are doped with an n type impurity. Retrograde impurity region 130 is formed in the semiconductor substrate 50 below the temporary gate oxide 52, having a gradually increasing impurity concentration extending from the main surface of the substrate 50. The impurity concentration peak of the retrograde impurity region 130 is formed within the confines of the buried amorphous region 120. Gate dielectric layer 150, e.g., a gate oxide layer, is formed on the main surface of semiconductor substrate 50 overlying the channel region formed between the shallow source/drain extensions 60, and gate electrode 170, e.g., polycrystalline silicon, is formed on the gate dielectric layer 150. The buried amorphous layer 120 formed under the channel region functions as a channel stop and suppresses diffusion of the displaced atoms and holes from the source/drain regions 80, thereby improving the transistor's short channel characteristics. Also, the retrograde impurity region 130 reduces the resistance against latch-up phenomenon, thereby improving device reliability. Furthermore, the retrograde impurity region 130 enables the portions of semiconductor substrate 50 surrounding the source/drain region 80 to be doped less than the conventional retrograde well structure, thereby reducing junction capacitance between the source/drain region 80 and substrate 50.

Given the disclosed objectives and guidance herein, optimum materials and dimensions of the local amorphization structure for localized retrograde and channel stop can be determined for a particular situation. For example: the retrograde impurity region 130 can be formed to have a impurity concentration peak extending into the substrate 50 to a depth greater than that of shallow source/drain extensions, but not greater than the depth of the source/drain regions.

Embodiments of the present invention involve the use of conventional materials and methodologies to form various components of a transistor and semiconductor device. For example, the semiconductor substrate employed in the embodiments of the present invention typically comprises doped monocrystalline silicon.

The present invention enjoys industrial applicability in various type of semiconductor device, particularly in various types of semiconductor device, particularly in semiconductor devices designed for high-speed performance. Therefore, the present invention is applicable to any CMOS technology.

In the previous description, numerous specific details are set forth such as specific material, structure, chemicals, process, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and a few examples of its versatility are shown and described in the present disclosure. It is to be understood that the present invention is capable of use in various other combinations and environments and is capable of changes or modifications within the scope of the inventive concept as expresses herein.

What is claimed is:

1. A method of manufacturing a semiconductor device, the method comprising:

forming source/drain regions of a first conductive type with a channel region therebetween in portions of a main surface of a substrate containing an impurity of a second conductive type;

ion implanting atoms into the substrate to form a buried amorphous region below the channel region; and ion implanting an impurity of the second conductive type into the substrate to form a retrograde impurity region, such that the retrograde impurity region of the second conductive type has an impurity concentration peak within the confines of the buried amorphous region.

2. The method according to claim 1, comprising:

forming an oxide layer on the main surface;

forming a conductive layer on the oxide layer; and ion implanting an impurity of the first conductive type to form the source/drain regions.

3. The method according to claim 2, comprising:

ion implanting the impurity of the first conductive type using the conductive layer and oxide layer as a mask to form shallow source/drain extensions;

forming sidewall spacers on side surfaces of the conductive layer and oxide layer;

ion implanting the impurity of the first conductive type, using the conductive layer and oxide layer and the sidewall spacers as a mask, to form the source/drain regions;

forming a dielectric layer on the main surface overlying the source/drain regions and exposing the conductive layer;

removing the conductive layer;

ion implanting the atoms into the substrate to form the buried amorphous region; and ion implanting the impurity of the second conductive type into the substrate to form the retrograde impurity region, such that the retrograde impurity region has a gradually increasing impurity extending from the main surface of the substrate to a depth greater than a depth of the shallow source/drain extensions, and the impurity concentration peak within the confines of the buried amorphous region.

4. The method according to claim 3, further comprising:

removing the oxide layer after forming the retrograde impurity region;

growing a gate oxide layer; and forming a gate electrode on the gate oxide layer.

5. The method according to claim 1, comprising ion implanting germanium, oxygen, silicon, and/or antimony to form the buried amorphous region.

6. The method according to claim 5, comprising ion implanting germanium at an implantation dosage of about $1 \times 10^{13}$ atoms cm$^{-2}$ to about $8 \times 10^{14}$ atoms cm$^{-2}$ and an implantation energy of about 15 KeV to about 50 KeV to form the buried amorphous region.

7. The method according to claim 1, further comprising annealing the substrate after ion implanting to form the retrograde impurity region.

8. The method according to claim 7, comprising rapid thermal annealing, after forming the retrograde impurity region, at a temperature of about 1020° C. to about 1050° C. for about 2 seconds to about 20 seconds in a nitrogen-containing environment.

* * * * *